(12) United States Patent
Somervell et al.

(10) Patent No.: US 9,454,081 B2
(45) Date of Patent: *Sep. 27, 2016

(54) LINE PATTERN COLLAPSE MITIGATION THROUGH GAP-FILL MATERIAL APPLICATION

(71) Applicant: TOKYO ELECTRON LIMITED, Tokyo (JP)

(72) Inventors: Mark H Somervell, Austin, TX (US); Benjamen M Rathsack, Austin, TX (US); Ian J Brown, Austin, TX (US); Steven Scheer, Houston, TX (US); Joshua S Hooge, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 14/323,664

(22) Filed: Jul. 3, 2014

(65) Prior Publication Data

US 2015/0125791 A1    May 7, 2015

Related U.S. Application Data

(63) Continuation of application No. 13/031,112, filed on Feb. 18, 2011, now Pat. No. 8,795,952.

(60) Provisional application No. 61/306,512, filed on Feb. 21, 2010.

(51) Int. Cl.
| | |
|---|---|
| H01L 21/3105 | (2006.01) |
| G03F 7/40 | (2006.01) |
| G03F 7/30 | (2006.01) |
| G03F 7/038 | (2006.01) |
| G03F 7/20 | (2006.01) |
| G03F 7/38 | (2006.01) |

(52) U.S. Cl.
CPC .............. *G03F 7/40* (2013.01); *G03F 7/038* (2013.01); *G03F 7/0384* (2013.01); *G03F 7/2024* (2013.01); *G03F 7/30* (2013.01); *G03F 7/38* (2013.01)

(58) Field of Classification Search
CPC .......... H01L 21/3086; H01L 21/3105; H01L 21/312
USPC ................................. 430/328, 330
See application file for complete search history.

(56) References Cited

U.S. PATENT DOCUMENTS

| | | | |
|---|---|---|---|
| 4,657,843 A | 4/1987 | Fukuyama et al. | |
| 5,770,523 A | 6/1998 | Hung et al. | |
| 6,271,147 B1 | 8/2001 | Tseng | |
| 6,576,714 B2 | 6/2003 | Saeki et al. | |
| 6,607,991 B1 | 8/2003 | Livesay et al. | |
| 8,795,952 B2 * | 8/2014 | Somervell ................ | G03F 7/30 430/314 |
| 2001/0001080 A1 | 5/2001 | Eldridge et al. | |
| 2003/0114010 A1 | 6/2003 | Jung | |
| 2004/0171761 A1 | 9/2004 | Kim et al. | |
| 2005/0224923 A1 | 10/2005 | Daley et al. | |
| 2005/0250055 A1 | 11/2005 | Hishiro | |
| 2005/0284502 A1 | 12/2005 | Watanabe et al. | |
| 2006/0124586 A1 | 6/2006 | Kobayashi et al. | |
| 2007/0009839 A1 | 1/2007 | Harumoto | |
| 2008/0179753 A1 | 7/2008 | Won et al. | |

FOREIGN PATENT DOCUMENTS

WO    WO2008084440    7/2008

OTHER PUBLICATIONS

Tsuda et al., Acid-Catalyzed Degradation Mechanism of Poly(phthalaldehyde): Unzipping Reaction of Chemical Amplification Resist, Journal of Polymer Science: Part A: Polymer Chemistry, Jan. 15, 1997, pp. 77-89, vol. 35 Issue 1, Wiley, New York, US.

Brachais et al., In Vitro Degradation of Poly(methyl glyoxlate) in Water, Polymer, Jun. 18, 1998, pp. 883-890, vol. 39, No. 4, Elsevier, Amsterdam, NL.

Belloncle et al., Synthesis and Degradation of Poly(ethyl glyoxylate), in chapter 4 of "Polymer Degradation and Performance", Jan. 1, 2009, pp. 41-51, ACS Symposium Series, American Chemical Society, Washington DC, US.

* cited by examiner

*Primary Examiner* — Daborah Chacko Davis

(57) ABSTRACT

Disclosed is a method and apparatus for mitigation of photoresist line pattern collapse in a photolithography process by applying a gap-fill material treatment after the post-development line pattern rinse step. The gap-fill material dries into a solid layer filling the inter-line spaces of the line pattern, thereby preventing line pattern collapse due to capillary forces during the post-rinse line pattern drying step. Once dried, the gap-fill material is depolymerized, volatilized, and removed from the line pattern by heating, illumination with ultraviolet light, by application of a catalyst chemistry, or by plasma etching.

20 Claims, 7 Drawing Sheets

| Polymer | Structure |
|---|---|
| Poly(vinyl alcohol) | |
| Poly(acrylamide) | |
| Poly(phthalaldehyde) | |
| Poly(succinaldehyde) | |
| Poly(allyl alcohol) | |
| Poly(glyoxylic acid) | |
| Poly(methyl glyoxylic acid) | |
| Poly(methyl glyoxylate) – ammonium salt | |
| Poly(ethyl glyoxylate) – ammonium salt | |
| Poly(methyl glyoxylate) – sodium salt | |
| Poly(ethyl glyoxylate) – sodium salt | |
| Poly(aspartic acid) | |

FIG. 6

LINE PATTERN COLLAPSE MITIGATION THROUGH GAP-FILL MATERIAL APPLICATION

CROSS REFERENCE TO RELATED APPLICATIONS

This application is a continuation of and claims the benefit of priority from co-pending U.S. patent application Ser. No. 13/031,112, entitled "LINE PATTERN COLLAPSE MITIGATION THROUGH GAP-FILL MATERIAL APPLICATION" (Ref. No. CT-095), filed on Feb. 18, 2011, which is a non-provisional of and claims the benefit of priority to U.S. Provisional Patent Application No. 61/306,512, entitled "LINE PATTERN COLLAPSE MITIGATION THROUGH GAP-FILL MATERIAL APPLICATION" (Ref. No. CT-095PRO), filed on Feb. 21, 2010, all of which applications are herein incorporated by reference in their entirety.

BACKGROUND OF THE INVENTION

1. Field of the Invention

The present invention relates to a method and apparatus for mitigation of photoresist line pattern collapse in a photolithography process by applying a gap-fill material treatment after the post-development line pattern rinse step, and subsequent removal thereof to expose the line pattern.

2. Description of Related Art

Photolithography processes for manufacturing semiconductor devices, liquid crystal displays (LCDs), and photovoltaics generally coat a layer of radiation-sensitive material, such as photoresist, on a substrate, expose the radiation-sensitive material coating to light to impart a latent image line pattern, and develop the exposed radiation-sensitive material coating to transform the latent image line pattern into a final image line pattern having masked and unmasked areas. Such a series of processing stages is typically carried out in a coating/developing system.

Feature sizes of semiconductor device circuits have been scaled to less than 0.1 micron. Typically, the pattern wiring that interconnects individual device circuits is formed with sub-micron line widths. In the post-development phase of a photolithography process, once a photoresist line pattern has been already formed, a deionized water rinse step is used to remove the developer from and clean the developed line pattern. Following the rinse step, the photoresist line pattern and substrate are dried so the substrate can be transported to the next processing tool for the next processing step. During the drying step, capillary forces arise at the interfaces between the deionized water or other rinse liquid, ambient air, and the photoresist material. The tighter the photoresist line pattern (i.e. the smaller the line pattern pitch), the larger the capillary forces become, and in some cases these forces can overcome the mechanical strength of the photoresist line pattern itself, leading to line pattern collapse. Once collapsed, the photoresist line pattern does not anymore represent an exact image of the image line pattern applied to the photoresist during the exposure step, leading to lower device yields, etc.

A number of ways have been used to mitigate line pattern collapse generally involving reducing the surface tension of the rinse liquid in contact with the photoresist. For example, a surfactant can be added to the rinse liquid (e.g. deionized water) to reduce the surface tension, and hence capillary forces acting upon the photoresist line pattern during the drying step. Another approach involves adding a reactive additive to the rinse liquid (e.g. deionized water), to react with the polymeric photoresist material, with the effect of modifying the surface energy of the photoresist and hence lowering the contact angle (i.e. wetting angle) and capillary forces. However, these methods may have limitations. For example, surfactants compatible with the photolithography process and materials can only reduce the surface tension a certain amount, and a larger reduction may be necessary to overcome the increase of capillary forces due to photoresist line pattern pitch reduction in newer generations of semiconductor devices. Therefore, there exists a need for a method of mitigating photoresist line pattern collapse without the above shortcomings, and which will be effective for next generations of semiconductor.

SUMMARY OF THE INVENTION

The present invention relates to a method and apparatus for mitigation of photoresist line pattern collapse in a photolithography process by applying a gap-fill material treatment after the post-development line pattern rinse step, and subsequent removal thereof to expose the line pattern.

According to an embodiment, a method of patterning a substrate is provided, comprising: forming a layer of radiation-sensitive material on the substrate; performing a patterned exposure of the layer of radiation-sensitive material; performing a post-exposure bake of the layer of radiation-sensitive material; developing the layer of radiation-sensitive material to form a radiation sensitive material pattern; rinsing the radiation-sensitive material pattern with a rinse liquid; dispensing gap-fill treatment liquid on the radiation-sensitive material pattern to displace the rinse liquid; and spinning the substrate to remove excess gap-fill treatment liquid and allow the remaining gap-fill treatment liquid to dry, thereby forming a gap-fill material layer which prevents collapse of the radiation-sensitive material pattern. These steps are followed by removing the gap-fill material layer from the radiation-sensitive material pattern.

According to further embodiments of the invention, the gap-fill material is depolymerized, volatilized, and removed from the line pattern by heating, illumination with electromagnetic (e.g. ultraviolet light or laser) radiation, by application of a catalyst chemistry, by plasma etching, or a combination of two or more thereof.

According to yet further embodiments of the invention, the gap-fill treatment liquid can comprise a polymer compound that depolymerizes into volatile compounds on exposure to at least one depolymerizing agent from the group consisting of heat, electromagnetic radiation, a catalyst, or a plasma in an etch processing tool.

According to yet further embodiments of the invention, the gap-fill treatment liquid can comprise at least one polymer compound from the group consisting of poly(vinyl alcohol), poly(acrylamide), poly(phtalaldehyde), poly(succinaldehyde), poly(allyl alcohol), poly(glyoxylic acid), poly(methyl glyoxylic acid), poly(ethyl glyoxylic acid), poly(methyl glyoxylate), poly(ethyl glyoxylate), and poly(aspartic acid). Furthermore, the gap-fill treatment liquid can comprise at least one polymer salt of the poly(methyl glyoxylic acid) and/or poly(ethyl glyoxylic acid), such as ammonium and sodium polymer salts thereof.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 6 shows a table of polymer compounds useful as gap-fill materials for photoresist line pattern collapse mitigation.

DETAILED DESCRIPTION OF EXEMPLARY EMBODIMENTS

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, photovoltaic device panel, etc., the processing of all of which falls within the scope of the claimed invention.

Figure 1:
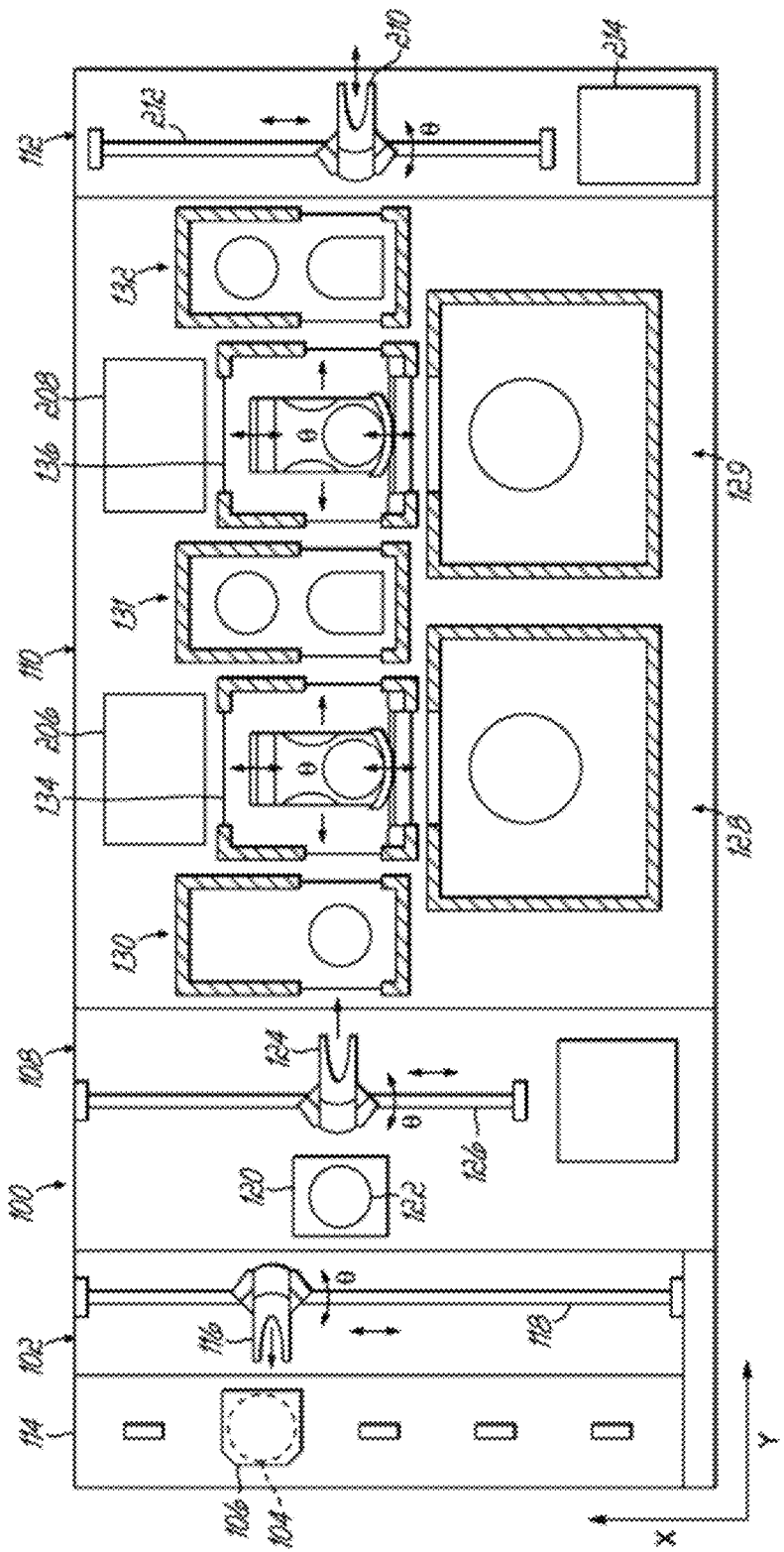
FIG. 1 is a plan view showing the general structure of a coating/developing system used to process substrates in accordance with an embodiment of the invention.

An exemplary coating/developing system 100, as shown in FIG. 1, may be constituted to integrally connect a cassette station 102, which transports a cassette typically holding 25 substrates, such as semiconductor wafers 104, for example, into the coating/developing system 100 from outside and which transports a wafer 104 to the cassette 106; an inspection station 108, which performs a predetermined inspection on the wafer 104; a processing station 110 with a plurality of types of processing devices disposed in stages to perform predetermined processes in a layered manner in the photolithography step; and an interface unit 112, provided adjacent to the processing station 110, for delivering the wafer 104 to an exposure device (not shown).

A cassette support stand 114 is provided at the cassette station 102; the cassette support stand 114 may freely carry a plurality of cassettes 106 in a row in the X direction (vertically, in FIG. 1). The cassette station 102 is provided with a wafer transporter 116 able to move on the transport path 118 in the X direction. The wafer transporter 116 may also move freely in the wafer array direction (Z direction; perpendicular) of the wafers 104 housed in the cassette 106 and can selectively access the wafer 104 vertically arrayed in the cassette 106. The wafer transporter 116 may rotate around an axis (θ direction) in the particular direction, and may also access the inspection station's transfer unit 120.

Disposed at the cassette station 102 side of inspection station 108 is the transfer unit 120 for transferring the wafer 104 from the cassette station 102. A carrying unit 122 for carrying the wafer 104 may be provided in the transfer unit 120. A wafer transporter 124 able to move on a transport path 126 in the X direction may be provided at the positive X direction side (upward in FIG. 1) of the inspection station 108. The wafer transporter 124 also may move vertically and rotate freely in the θ direction, and may also access the transfer unit 120 and each processing device in a processing device group 130 at the processing station 110 side.

A processing station 110 adjacent to the inspection station 108 is provided with a plurality of processing devices disposed in stages, such as five processing device groups 128-132. The first processing device group 128 and the second processing device group 129 are disposed in sequence from the inspection station 108 side, at the negative X direction side (downward in FIG. 1) of the processing station 110. The third processing device group 130, fourth processing device group 131, and fifth processing device group 132 are disposed in sequence from the inspection station 108 side, at the positive X direction side (upward in FIG. 1) of the processing station 110. A first transport device 134 is provided between the third processing device group 130 and the fourth processing device group 131. The first transport device 134 may transport the wafer 104 to access each device in the first processing device group 128, third processing device group 130, and fourth processing device group 131. A second transport device 136 transports the wafer 104 and selectively accesses the second processing device group 129, fourth processing device group 131, and fifth processing device group, 132.

Figure 2:
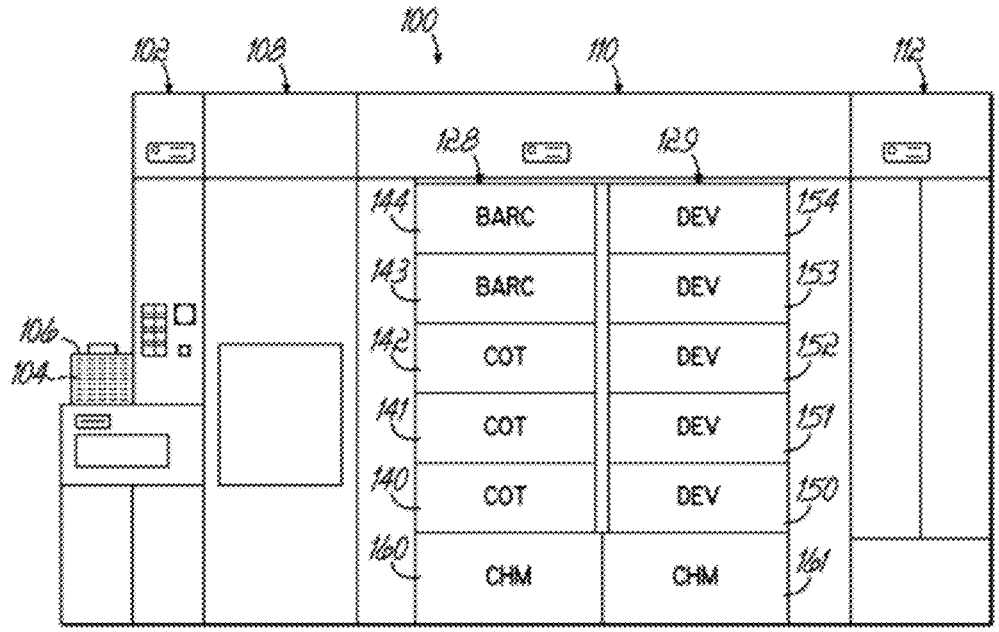
FIG. 2 is a front view of the coating/developing system in FIG. 1.

With further reference to FIG. 2, the first processing device group 128 stacks liquid processing devices that supply a predetermined liquid spin-on material to the wafer 104 and process it. Devices such as spin coating devices 140, 141, and 142, which may apply a photoresist solution to the wafer 104 and form a photoresist film, and bottom coating devices 143 and 144, which form an anti-reflection film that prevents light reflection during exposure processing, may be arranged in five levels in sequence from the bottom. The second processing device group 129 stacks liquid processing devices such as developing devices 150-154, which supply developer (i.e. developer liquid) to the wafer 104 and develop it, in five levels in sequence from the bottom. Also, terminal chambers 160 and 161 are provided at the lowest stages of the first processing device group 128 and the second processing device group 129 in order to supply processing liquids to the liquid processing devices in the processing device groups 128 and 129.

Figure 3:
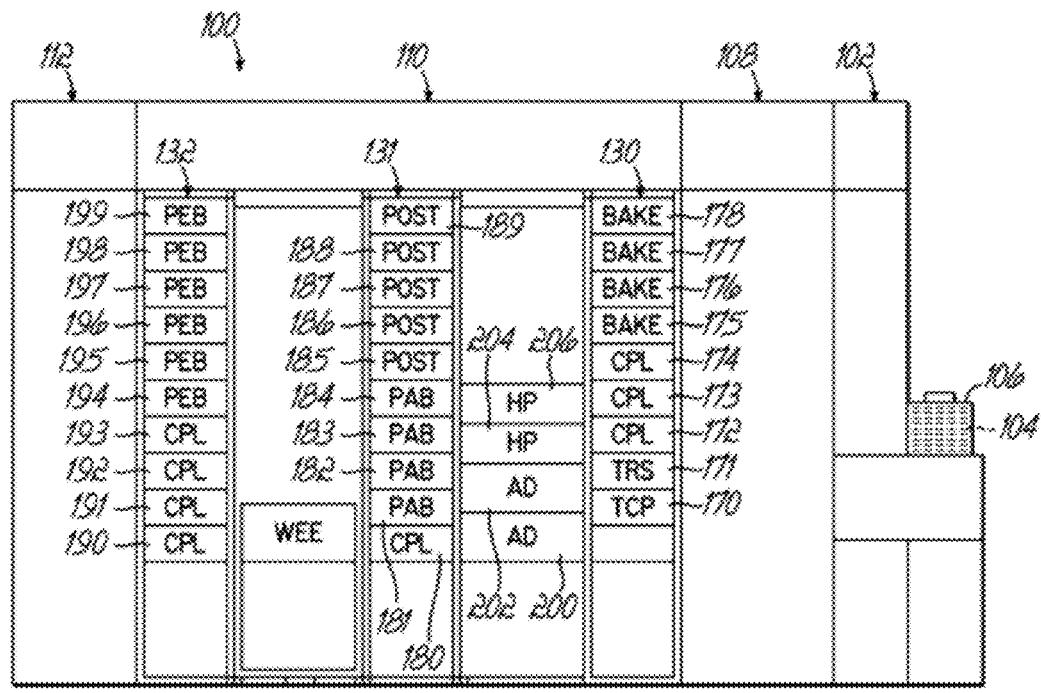
FIG. 3 is a rear view of the coating/developing system in FIG. 1.

Also, as shown in FIG. 3, for example, the third processing device group 130 stacks temperature regulation device 170, transition device 171 for transfer of the wafer 104, high precision temperature regulation devices 172-174, which regulate the temperature of the wafer 104 under high precision temperature management, and high temperature heating devices 175-178, which heat the wafer 104 to high temperature, in nine levels in sequence from the bottom.

The fourth processing device group 131 stacks a high precision temperature regulation device 180, pre-baking devices 181-184 for heating the wafer 104 after photoresist coating processing, and post-baking devices 185-189, which heat the wafer 104 after developing, in ten levels in sequence from the bottom. Each of the pre-baking devices 181-184 and post-baking devices 185-189 includes at least one hot plate wafer holder (not shown) for elevating the temperature of the wafer 104 and the layer on the wafer 104.

The fifth processing device group 132 stacks a plurality of heating devices that heat the wafer W, such as high precision temperature regulation devices 190-193, and post-exposure baking devices 194-199 in ten levels in sequence from the bottom.

Figure 5:
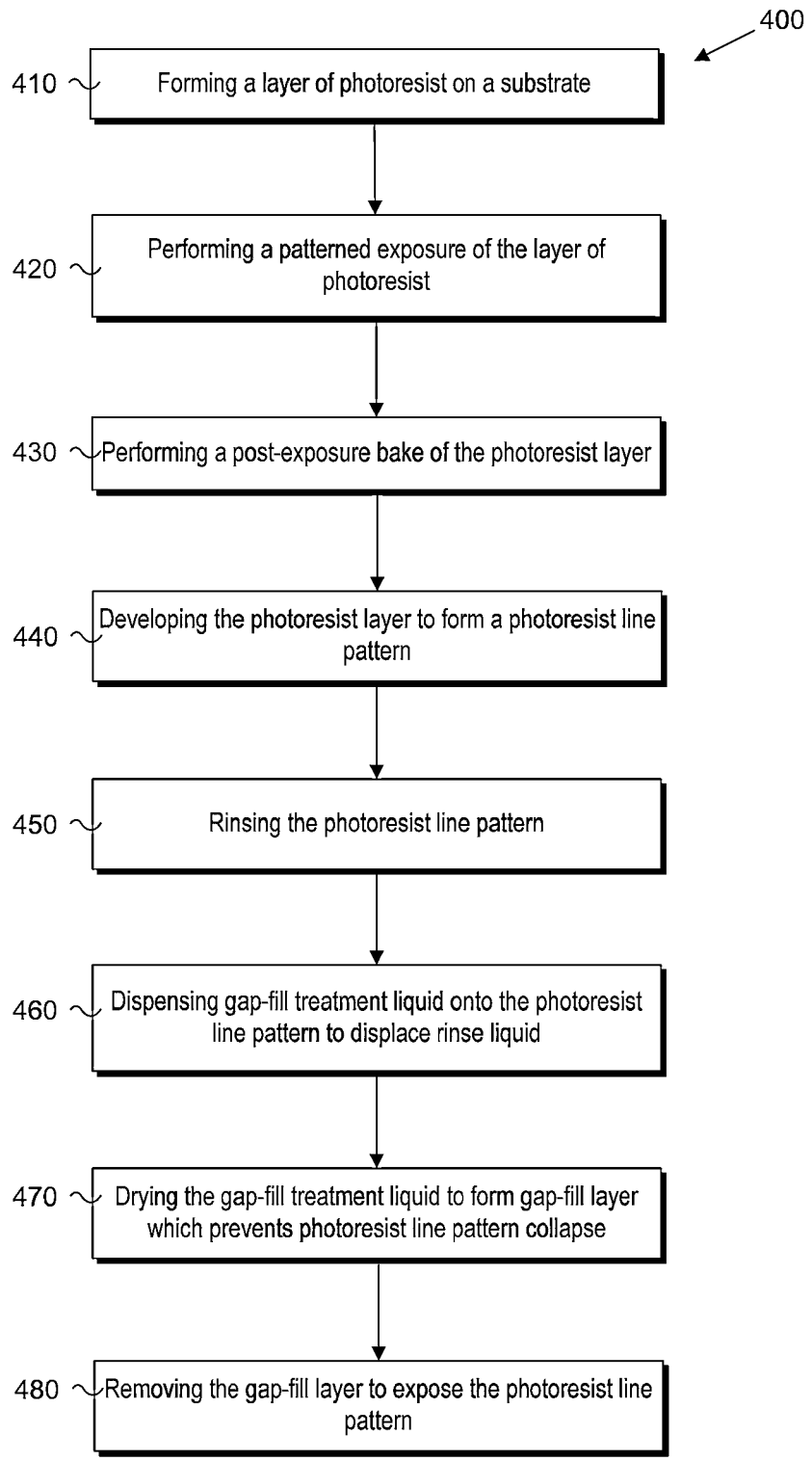
FIG. 5 is a flowchart of an embodiment of a method for mitigation of photoresist line pattern collapse by the application of gap-fill material.

A plurality of processing devices may be disposed at the positive X direction side of the first transport device 134 as shown in FIG. 1. Adhesion devices 200 and 202 for making the wafer 104 hydrophobic and heating devices 204 and 206 for heating the wafer 104 are stacked in four levels in sequence from the bottom, as shown in FIG. 5, for example. A peripheral exposure device 208 for selectively exposing only the edge of the wafer 104 may be disposed at the positive X direction side of the second transport device 136 as shown in FIG. 1.

Provided in the interface unit 112 are a wafer transporter 210 that moves on a transport path 212 extending in the X direction as shown in FIG. 1 and a buffer cassette 214. The wafer transporter 210 can move in the Z direction and can rotate in the θ direction; and can transport the wafer 104 and access the exposure device (not shown) adjacent to the interface unit 112 and the buffer cassette 214 and the fifth processing device group 132.

Figure 4:
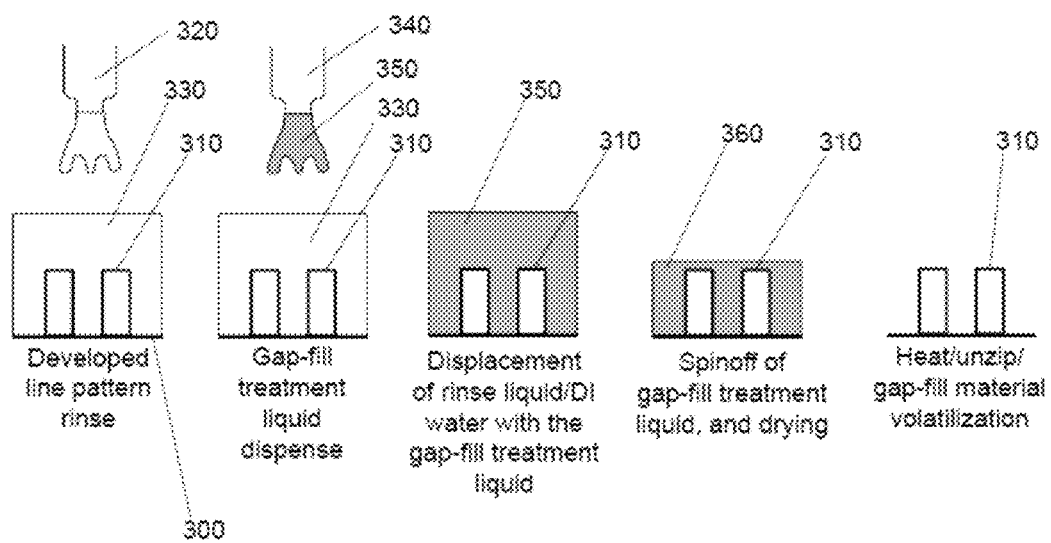
FIG. 4 is schematic of an embodiment of a method for mitigation of photoresist line pattern collapse by the application of gap-fill material.

FIG. 5 shows a flowchart of an exemplary embodiment of a photolithography process 400 comprising steps for mitigating collapse of photoresist line patterns. FIG. 4 depicts the same process outlined in the flowchart of FIG. 5 starting with rinsing step 450, and ending with the gap-fill layer removal step 480. In step 410, the substrate (e.g. a semiconductor wafer, LCD panel, or photovoltaic device panel) is coated with a layer of photoresist in e.g. spin coating devices 140, 141, and 142, of coating/developing system 100, of FIGS. 1-3. In step 420, the photoresist layer is exposed to light to impart a latent image line pattern therein. This step is performed in an exposure device (not shown in FIGS. 1-3). In step 430, the substrate is exposed to an elevated temperature in a post-exposure bake step, which serves multiple purposes in photoresist processing. First, the elevated temperature of the bake drives the diffusion of the photoproducts (i.e. photo-acid) in the photoresist. A small amount of diffusion may be useful in minimizing the effects of standing waves, which are the periodic variations in exposure dose throughout the depth of the photoresist layer that result from interference of incident and reflected radiation during exposure. Another main purpose of the bake is to drive an acid-catalyzed reaction that alters polymer solubility in many chemically amplified resists. Post-exposure bake also plays a role in removing solvent from the substrate surface. In step 440, the substrate is transferred to a developing device, such as for example, one of developing devices 150-154 of coating/developing system 100, of FIGS. 1-3. In the developing device, developer (i.e. developer liquid) is dispensed onto the substrate to activate the photoproducts in the photoresist, and thereby develop portions of the photoresist, leaving a developed photoresist line pattern on the substrate.

With further reference to the flowchart of FIG. 5, and the schematic of FIG. 4, in step 450, excess developer is rinsed from the developed photoresist line pattern 310, and the substrate 300 by dispensing rinse liquid 330, such as deionized water, from a rinse liquid nozzle 320. The rinse liquid 330 may contain various additives, such as surfactants to reduce the surface tension of the rinse liquid 330, and to aid in displacing the developer. In step 460, in order to prevent photoresist line pattern 310 from collapsing during the step of drying rinse liquid 330 from the substrate, a gap-fill treatment liquid 350 is dispensed onto the photoresist line pattern 310, and substrate 300, to fully displace the rinse liquid 330. In step 470, excess gap-fill treatment liquid 350 is spun off the substrate 300 and photoresist line pattern 310, typically by spinning (i.e. rotating) the substrate 300 within one of the developing devices 150-154 of coating/developing system 100, of FIGS. 1-3. Once excess gap-fill treatment liquid is removed, the remaining amount is allowed to dry and form a solid gap-fill layer 360, which fills the inter-line spaces of the photoresist line pattern 310, preventing collapse thereof during drying. Finally, in step 480, the gap-fill material layer is removed from the substrate 300, thereby exposing the photoresist line pattern 310. The step 480 of removing the gap-fill layer 360 can be performed in a multitude of ways, e.g. using a dry etch process in an etch tool, or using a depolymerizing agent, such as heat, electromagnetic radiation, or a chemical catalyst to cause depolymerization of the gap-fill polymer material. During depolymerization, volatile monomer compounds are formed and evolved from the surface of the gap-fill layer material, and eventually the entire gap-fill layer 360 is removed from the photoresist line pattern 310. The process of depolymerization will be discussed in greater detail later. It is important to note that, unlike during conventional drying of rinse liquid 330, the depolymerization, volatilization, and evolution of the solidified gap-fill layer 360 during step 480 does not give rise to capillary forces, and therefore the risk of photoresist line pattern collapse is mitigated.

The gap-fill treatment liquid 350 and solidified gap-fill layer material have to satisfy a number of requirements to be suitable for use in the photolithography process 400. First, the gap-fill treatment liquid 350 has to comprise a polymer that is soluble in a solvent so it can be spun onto the substrate 300 inside the developing device, such as one of developing devices 150-154 of coating/developing system 100, of FIGS. 1-3. For compatibility with the developer and rinse liquids used within the same developing device, it is preferable that the polymer be water-soluble (i.e. employ water as a solvent). However, it is also possible to use a polymer which is not water-soluble, but utilizes a solvent such as e.g. an alcohol, which is chemically compatible with other liquids used in the developing device. The solvent is evolved from the gap-fill treatment liquid 350 during the drying step 470 to form the gap-fill layer 360. The gap-fill treatment liquid also needs to be self-planarizing during the spin-off and drying step 470, it has to have good pattern wetting and filling properties so as to not leave voids between the photoresist pattern lines, and it also has to completely displace the rinse liquid and be chemically compatible with it.

Second, the polymer of which the solidified gap-fill layer 360 is comprised has to be readily removable. If a plasma etch process is used for removal of gap-fill layer 360, it is important that the gap-fill polymer plasma etch process have good selectivity with respect to photoresist and other materials that are exposed to the plasma etch process chemistry. In other embodiments, the gap-fill layer can be caused to depolymerize (i.e. unzip) into volatile monomer compounds which are readily evolved from the surface of gap-fill layer 360 and pumped away, to expose the photoresist line pattern 310. If a depolymerization removal process is used, then the polymer needs to readily respond to the application of a depolymerization agent, such as heat, electromagnetic radiation, or a chemical catalyst, by breaking-up into volatile monomer compounds.

Figure 8:
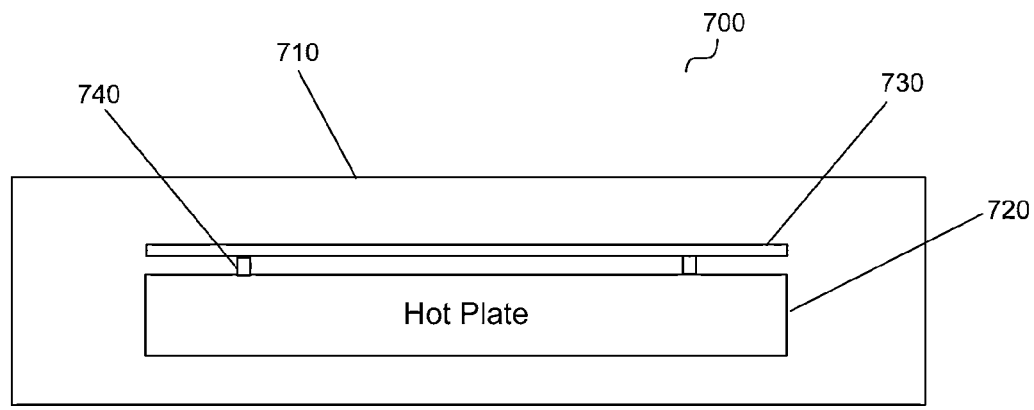
FIG. 8 is a schematic of an exemplary embodiment of a heating device in accordance with an embodiment of the invention.

In one exemplary embodiment, a polymeric compound can be depolymerized by elevating the temperature of the substrate 300 and all layers deposited thereupon, in a heating device such as high temperature heating devices 175-178 of coating/developing system 100, of FIGS. 1-3. Other devices, such as pre-baking devices 181-184 and post-baking devices 185-189 of coating/developing system 100, of FIGS. 1-3, can also be used to elevate the substrate temperature to depolymerize the gap-fill layer material. An exemplary schematic of a heating device 700 is shown in FIG. 8. The heating device 700 comprises an enclosure 710, inside which a hot plate 720 is disposed and configured to receive a substrate 730, with a gap-fill layer 360 formed thereon. Heaters embedded in the hot plate 720 are used to elevate the temperature of substrate 730 and the gap-fill layer 360. Optional lift pins 740 can be used to elevate the substrate 730 from the hot plate 720 during the heating step, to improve heating uniformity. The temperature to which the substrate 300 and gap-fill layer 360 have to be heated depends on the gap-fill material depolymerization (i.e. unzip) temperature, the resistance of the photoresist and other surrounding materials to elevated temperatures, etc. In general, the temperature used can vary from about 10° C. to 20° C. below the gap-fill material depolymerization temperature, to almost as high as the temperature at which photoresist is damaged. With the above in mind, and for typical gap-fill polymers and photoresist materials, practical depolymerization temperatures will vary from 30° C. to 200° C., and more preferably from 50° C. to 150° C.

Figure 9:
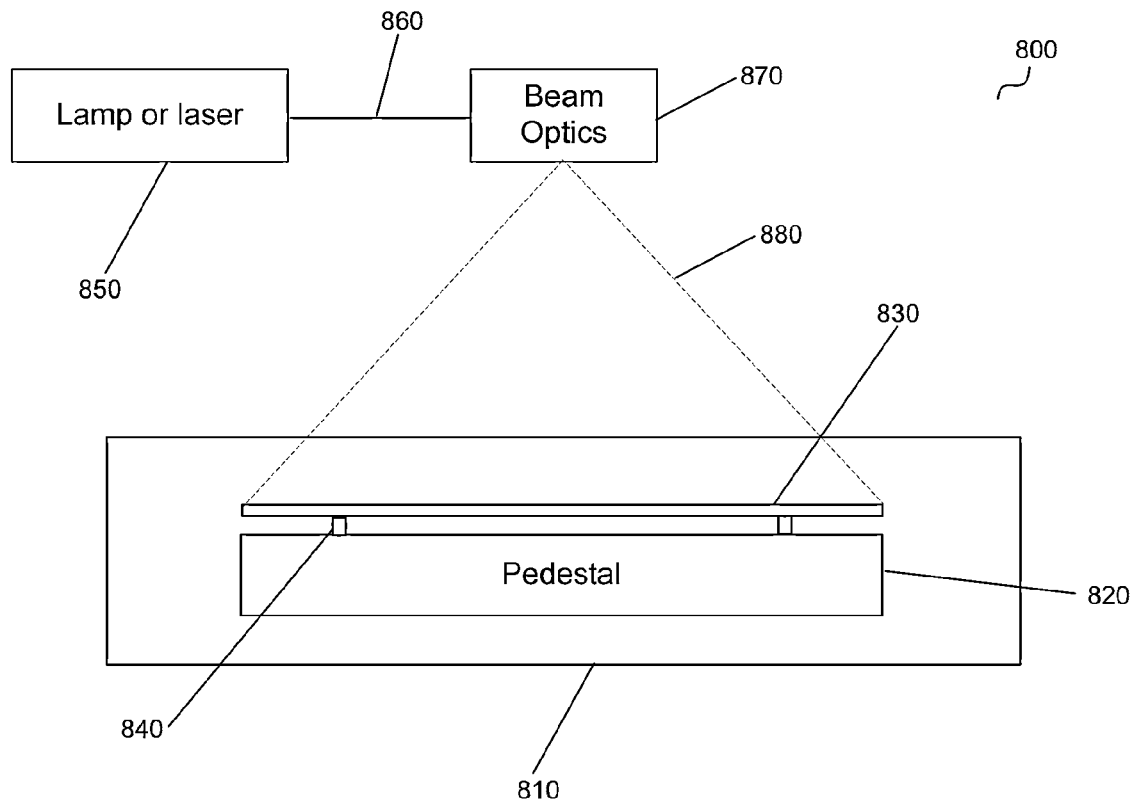
FIG. 9 is a schematic of an exemplary embodiment of an illumination device in accordance with an embodiment of the invention.

In another exemplary embodiment, a polymeric compound can be depolymerized by illumination with electromagnetic radiation. This can be achieved in a module of coating/developing system 100, of FIGS. 1-3 (not shown), in which a lamp, laser, or similar device, are used as a source of electromagnetic radiation which causes the gap-fill material to depolymerize. FIG. 9 shows an exemplary schematic of an illumination device 800, to be used for illumination of gap-fill layer 360 with electromagnetic radiation. Illumination device 800 comprises an enclosure 810, inside which a pedestal 820 is disposed to receive a substrate 830 with a gap-fill layer 360 deposited thereupon. Optional lift pins 840 can be used to elevate the substrate during illumination to reduce heat loss from the substrate 830 during illumination. A light source 850 is used to generate electromagnetic radiation for illumination of the gap-fill layer 360. The light source 850 can be a lamp, laser, or a combination of two or more thereof. In one exemplary embodiment, an ultraviolet lamp can be used as light source 850, to illuminate the gap-fill layer 360 with ultraviolet light of sufficiently high photon energy to initiate polymer bond breakage, and depolymerization. In another embodiment, a visible light or infrared lamp can be used as light source 850, the latter causing depolymerization primarily via a heating effect. In yet another embodiment, a laser, such as a visible light or infrared laser, can be used as light source 850. The laser comprising the light source 850 can be operated in continuous or pulsed (i.e. spike illumination) mode, the latter being particularly suitable for gap-fill layer illumination because an exact dose of electromagnetic radiation can be delivered to the gap-fill layer 360 without causing undue heating of underlying layers and the substrate, which allows safe processing of devices with a relatively low thermal budget. Typical pulse (i.e. spike) times can range from 1 ms to 100 ms, or more preferably from 1 ms to 10 ms. Pulsed illumination is also possible with a lamp used as light source 850. An optical waveguide 860 guides the electromagnetic radiation from light source 850 to the beam shaping optics 870. The beam shaping optics 870 ensure that the electromagnetic radiation from light source 850 is evenly distributed over the substrate 830 and gap-fill layer 360. This even illumination can be achieved in a number of ways. In one embodiment, a system of fixed optics (e.g. mirrors, lenses, and waveguides) can be employed to spread the electromagnetic radiation into light beam 880, reaching all points on the substrate 830 and gap-fill layer 360, simultaneously. Alternatively, beam shaping optics 870 can comprise an optical scanner element that directs the light beam 880 onto just a portion of substrate 830 and gap-fill layer 360, scanning the light beam over time to process other portions of substrate 830. Alternatively yet, fixed beam shaping optics 870 can be configured to illuminate only a portion of substrate 830 and gap-fill layer 360, and the pedestal 820 can be mounted on a translation and/or rotation stage (not shown), allowing all portions of the substrate 830 and gap-fill layer 360 to be illuminated by scanning the pedestal 820 with a substrate 830 under the light beam 880. In embodiments where pulsed (i.e. spike) illumination is used, the pulse illumination can optionally be synchronized with the scanning of light beam 880 or the scanning of pedestal 820, via a controller (not shown), to evenly illuminate the entire gap-fill layer 360.

In yet another exemplary embodiment, a chemical catalyst compound can be applied to the gap-fill layer 360 which will initiate gap-fill material polymer bond breakage, and cause it to depolymerize and evolve. Typically, an acid catalyst would be used to initiate polymer bond breakage. The advantage of this embodiment is that the gap-fill layer removal step 480 can be performed in the developing device, i.e. without having to transport the substrate to another module of the coating/developing system.

Figure 7:
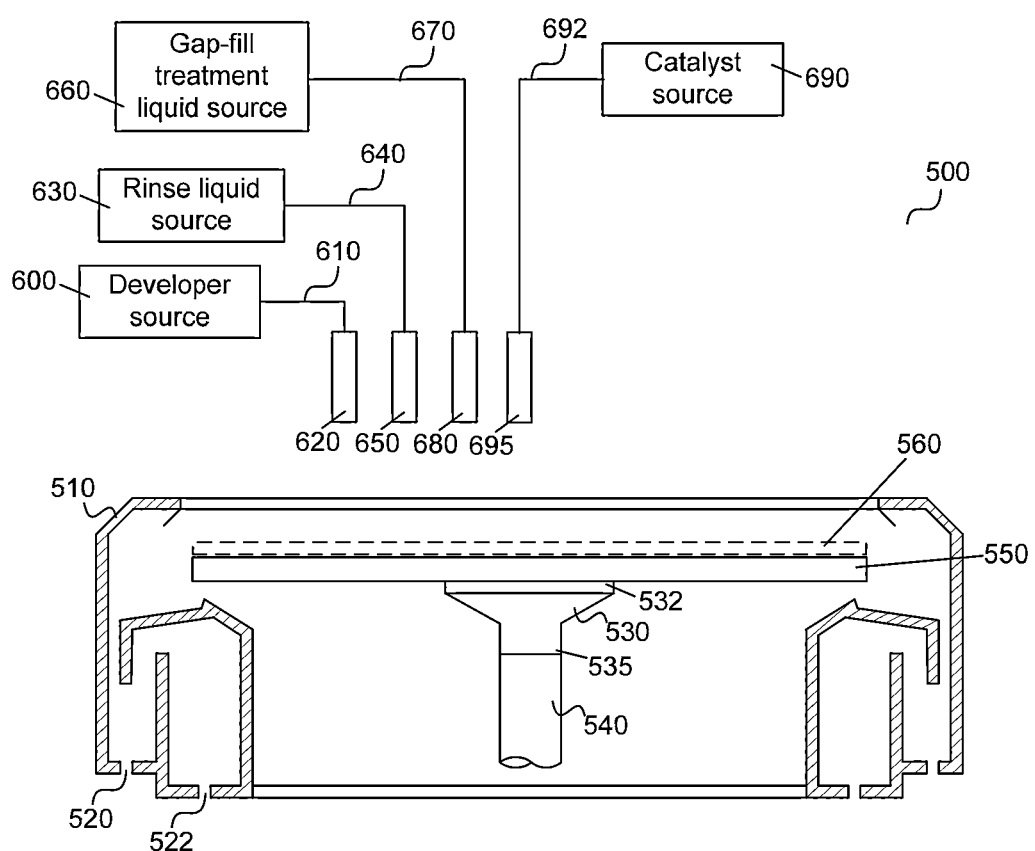
FIG. 7 is schematic of an exemplary embodiment of a developing device capable of performing, in part, the method outlined in the flowchart of FIG. 5.

FIG. 7 shows an embodiment of a developing device, such as one of developing devices 150-154 of coating/developing system 100, of FIGS. 1-3, suitable for performing portions of the photolithography process 400 outlined in FIGS. 4 and 5. Developing device 500 comprises a cup 510 inside which a substrate chuck or support structure 530 is configured to receive and clamp a substrate 550 thereupon. The substrate chuck 530 has a first end 532 configured to clamp the substrate, typically using a vacuum or electrostatic force, and a second end 535 attached to a spindle 540 of a drive motor (not shown) which is used to spin the substrate during dispensing and spin-off steps. Excess dispensed liquid is fed outside the cup 510 via liquid ports 520, and vapors are pumped-out via vapor ports 522. During each dispensing step performed in the developing device 500, a layer 560 of the dispensed liquid is formed on the top surface of substrate 550.

With further reference to FIG. 7, the developing device 500 comprises at least four nozzles 620, 650, 680, and 695 used to dispense developer, rinse liquid, gap-fill treatment liquid, and catalyst liquid respectively. In some embodiments, multiple nozzles or arrays of nozzles can be used to dispense a liquid, instead of single nozzles 620, 650, 680, and 695. Also, the nozzles or nozzle arrays can be stationary or movable to facilitate uniform dispensing of liquids onto the substrate surface. Nozzles 620, 650, 680, and 695 are connected to developer source 600, rinse liquid source 630, gap-fill treatment liquid source 660, and catalyst liquid source 690, via tubing runs 610, 640, 670, and 692, respectively. In performing the steps of photolithography process 400 of FIGS. 4 and 5, the nozzles 620, 650, 680, and 695 are opened, and sources 600, 630, 660, and 690 are activated to dispense the developer, rinse liquid, gap-fill treatment liquid, or catalyst liquid during steps 440, 450, 460, and 480, respectively, of photolithography process 400 depicted in FIG. 5. The addition of a catalyst nozzle 695 to the developing device 500 allows catalyst-initiated depolymerization of the gap-fill layer 360 to occur immediately after drying step 470, and without the need for removing the substrate 550 from developing device 500.

In another alternative embodiment, a developing device 500 can be equipped with a light source and beam shaping optics, such as light source 850 and beam shaping optics 870, of illumination device 800, to allow illumination of substrate 550 within the developing device 500. This embodiment does not require that separate illumination devices, such as illumination device 800, be installed inside coating/developing system 100, of FIGS. 1-3.

FIG. 6 shows a number of polymer compounds that can be used as a gap-fill treatment liquid and that may solidify into a suitable gap-fill layer material. In general, most polymer materials have very low depolymerization (i.e. ceiling) temperatures, i.e. below typical ambient temperatures, so they are typically end-capped to increase their stability. The process of depolymerizing via application of one of the above depolymerizing agents (heat, electromagnetic radiation, or a catalyst) starts by the agent causing bond breakage "events", after which the polymer fully "unzips".

In one exemplary embodiment, poly(methyl glyoxylate) is used as a gap-fill polymer. This compound is a polymeric salt of the poly(methyl glyoxylic acid), wherein the ion can be e.g. a sodium ion $Na^+$, or an ammonium ion $NH_4^+$. In a preferred embodiment, the ammonium salt is used because upon application of heat to this polymeric salt, two useful chemical changes occur. First, the ammonium ion $NH_4^+$ will give up a hydrogen atom to the poly(methyl glyoxylate), and become ammonia $NH_3$, which readily evolves from the polymer. And second, because the polymer has oxygen in its backbone, it is unstable, and will "unzip" if one of the oxygen bonds are broken due to action of a depolymerization agent, such as heat, with the resulting monomer compounds also evolving from the polymer. Other compounds listed in FIG. 6 have similar depolymerization mechanisms, some of which are described in the literature, e.g. Brachais et al., "In Vitro Degradation of poly(methyl glyoxylate) in Water", Polymer, vol. 39, pp. 883-890, 1998; Tsuda et al., "Acid-catalyzed Degradation Mechanism of poly(phthalaldehyde): Unzipping Reaction of Chemical Amplification Resist", Journal of Polymer Science: Part A, Polymer Chemistry, vol. 35, pp. 77-89, 1997; and Belloncle et al., "Synthesis and Degradation of poly(ethyl glyoxylate)", in "Polymer Degradation and Performance", chap. 4, pp. 41-51, ACS Symposium Series, ACS 2009, the contents of all of which are incorporated herein in their entirety. Additionally, U.S. Pat. No. 6,576,714 entitled "Production Process for Glyoxylic Acid (Salt)-Based Polymer", to Saeki et al., provides useful background information about the stability, end-capping, production, etc., of polymeric salts of the glyoxylic acid, and is also incorporated herein in its entirety.

With further reference to FIG. 6, the polymer compound poly(phthalaldehyde), also known by its IUPAC name poly(o-phthalaldeyde), is a polymer of monomer phthalaldehyde, which monomer is also known by its IUPAC names o-phthalaldehyde and ortho-phthalaldehyde.

In another embodiment, a gap-fill treatment liquid 350 can be used, with or without a solvent, which would react with the rinse liquid, e.g. deionized water present at the substrate, to form an in-situ gel that fills inter-line spaces in the photoresist line pattern 310. The gel would be removed using similar process steps to those described above, e.g. using plasma etch, or depolymerized the gel by applying heat, electromagnetic radiation, or a chemical catalyst.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method of patterning a substrate, comprising:
    forming a layer of radiation-sensitive material on the substrate;
    performing a patterned exposure of the layer of radiation-sensitive material;
    performing a post-exposure bake of the layer of radiation-sensitive material;
    developing the layer of radiation-sensitive material to form a radiation sensitive material pattern;
    rinsing the radiation-sensitive material pattern with a rinse liquid;
    dispensing gap-fill treatment liquid on the radiation-sensitive material pattern to displace the rinse liquid;
    spinning the substrate to remove excess gap-fill treatment liquid and allow the remaining gap-fill treatment liquid to dry, thereby forming a gap-fill material layer which prevents collapse of the radiation-sensitive material pattern; and
    removing the gap-fill material layer from the radiation-sensitive material pattern,
    wherein the step removing the gap-fill material layer comprises exposing the gap-fill material layer to electromagnetic radiation, heating the gap-fill material layer by a heat source, exposing the gap-fill material layer to a catalyst, etching the gap-fill material layer, or a combination of two or more thereof, and
    wherein the gap-fill treatment liquid comprises at least one polymer compound from the group consisting of poly(phthalaldehyde), poly(succinaldehyde), poly(allyl alcohol), poly(glyoxylic acid), poly(methyl glyoxylic acid), a polymeric salt of poly(methyl glyoxylic acid), poly(ethyl glyoxylic acid), a polymeric salt of poly (ethyl glyoxylic acid), poly(methyl glyoxylate), and poly(ethyl glyoxylate).

2. The method of claim 1, wherein the electromagnetic radiation comprises infrared radiation.

3. The method of claim 1, wherein the electromagnetic radiation comprises visible light radiation.

4. The method of claim 1, wherein the electromagnetic radiation comprises ultraviolet radiation.

5. The method of claim 1, wherein the electromagnetic radiation is generated by a lamp.

6. The method of claim 1, wherein the electromagnetic radiation is generated by a laser.

7. The method of claim 1, wherein the electromagnetic radiation is applied in a pulsed manner.

8. The method of claim 1, wherein the catalyst comprises an acid.

9. The method of claim 1, wherein the heat source is a hot plate substrate holder.

10. The method of claim 9, wherein the gap-fill material layer is heated to a temperature between 30° C. and 200° C.

11. The method of claim 9, wherein the gap-fill material layer is heated to a temperature between 50° C. and 150° C.

12. The method of claim 1, wherein the gap-fill treatment liquid comprises a solvent.

13. The method of claim 12, wherein the solvent comprises water.

14. The method of claim 12, wherein the solvent comprises an alcohol.

15. The method of claim 1, wherein the gap-fill treatment liquid comprises a polymer compound that depolymerizes into volatile compounds on exposure to at least one depolymerizing agent from the group consisting of heat, electromagnetic radiation, and a catalyst.

16. The method of claim 1, wherein the polymeric salt of poly(methyl glyoxylic acid) is an ammonium salt of poly(methyl glyoxylic acid).

17. The method of claim 1, wherein the polymeric salt of poly(methyl glyoxylic acid) is a sodium salt of poly(methyl glyoxylic acid).

18. The method of claim 1, wherein the polymeric salt of poly(ethyl glyoxylic acid) is an ammonium salt of poly(ethyl glyoxylic acid).

19. The method of claim 1, wherein the polymeric salt of poly(ethyl glyoxylic acid) is a sodium salt of poly(ethyl glyoxylic acid).

20. The method of claim 1, wherein the steps of developing the layer of radiation-sensitive material, rinsing the radiation sensitive material pattern, dispensing the gap-fill treatment liquid, spinning the substrate, and removing the gap-fill material layer are all performed in the same developing device.

* * * * *